(12) United States Patent
Yamamine et al.

(10) Patent No.: US 10,690,011 B2
(45) Date of Patent: Jun. 23, 2020

(54) POWER GENERATION SYSTEM, MANAGEMENT DEVICE, AND SEMICONDUCTOR MANUFACTURING APPARATUS

(71) Applicant: KOKUSAI ELECTRIC CORPORATION, Tokyo (JP)

(72) Inventors: Naotoshi Yamamine, Toyama (JP); Hideo Ishizu, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 16/111,505

(22) Filed: Aug. 24, 2018

(65) Prior Publication Data

US 2019/0003342 A1     Jan. 3, 2019

Related U.S. Application Data

(63) Continuation of application No. PCT/JP2016/077855, filed on Sep. 21, 2016.

(30) Foreign Application Priority Data

Feb. 26, 2016   (JP) ................................ 2016-035363

(51) Int. Cl.
   *F01K 13/02*     (2006.01)
   *F01K 27/02*     (2006.01)
   (Continued)

(52) U.S. Cl.
   CPC .............. *F01K 13/02* (2013.01); *F01K 27/02* (2013.01); *H01L 21/67109* (2013.01);
   (Continued)

(58) Field of Classification Search
   CPC ........... F01K 13/02; F01K 27/02; H01L 35/30
   (Continued)

(56) References Cited

U.S. PATENT DOCUMENTS 9,064,913 B2    6/2015  Nakagawa
2009/0288414 A1*  11/2009  Takeshita ................ F01D 17/08
                                                60/645

(Continued)

FOREIGN PATENT DOCUMENTS

JP    2002-372206 A    12/2002
JP    2004-055558 A     2/2004

(Continued)

OTHER PUBLICATIONS

English translation of JP-2014-055558 (Year: 2014).*

(Continued)

*Primary Examiner* — Sean Gugger
(74) *Attorney, Agent, or Firm* — Volpe and Koenig, P.C.

(57) ABSTRACT

There is provided a technique of a power generation system for performing power generation by introducing a cooling medium for cooling a plurality of semiconductor manufacturing apparatuses into a power generation part, wherein the system comprises a plurality of cooling medium passages, through which the cooling medium for cooling the semiconductor manufacturing apparatuses flows and connected to the power generation part. The system is configured to control an opening/closing part installed in each of the plurality of cooling medium passages based on a temperature of the cooling medium and to control inflow of the cooling medium from the plurality of cooling medium passages to the power generation part such that a temperature of the cooling medium flowing into the power generation part is equal to or higher than a predetermined temperature.

12 Claims, 7 Drawing Sheets

(51) Int. Cl.
  *H01L 35/30* (2006.01)
  *H01L 21/67* (2006.01)
  *F01K 25/10* (2006.01)
  *F01K 7/16* (2006.01)

(52) U.S. Cl.
  CPC ........ *H01L 21/67248* (2013.01); *H01L 35/30* (2013.01); *F01K 7/16* (2013.01); *F01K 25/10* (2013.01)

(58) Field of Classification Search
  USPC .............................................................. 290/2
  See application file for complete search history.

(56) References Cited

U.S. PATENT DOCUMENTS

| | | | | |
|---|---|---|---|---|
| 2012/0073294 | A1* | 3/2012 | Enokijima | F01K 13/02 60/660 |
| 2012/0073295 | A1* | 3/2012 | Enokijima | F01K 13/02 60/660 |
| 2014/0075941 | A1* | 3/2014 | Adachi | F01K 23/08 60/646 |
| 2014/0206204 | A1* | 7/2014 | Nakagawa | F01K 25/14 438/795 |
| 2019/0093537 | A1* | 3/2019 | Grelet | B60K 13/04 |

FOREIGN PATENT DOCUMENTS

| | | |
|---|---|---|
| JP | 2013-157446 A | 8/2013 |
| JP | 2013-204468 A | 10/2013 |
| JP | 2014-055558 A | 3/2014 |
| JP | 2014-175478 A | 9/2014 |
| WO | 2013/047320 A1 | 4/2013 |

OTHER PUBLICATIONS

English translation of JP 2002-372206 (Year: 2002).*
International Search Report, PCT/JP2016/077855, dated Nov. 1, 2016, 2pgs.

* cited by examiner

POWER GENERATION SYSTEM, MANAGEMENT DEVICE, AND SEMICONDUCTOR MANUFACTURING APPARATUS

CROSS-REFERENCE TO RELATED APPLICATIONS

This application is a Bypass Continuation Application of PCT International Application No. PCT/JP2016/077855, filed on Sep. 21, 2016, the entire contents of which are incorporated herein by reference.

TECHNICAL FIELD

The present disclosure relates to a power generation system, a management device, and a semiconductor manufacturing apparatus.

BACKGROUND

Recently, due to problems such as environmental changes, climate changes or the like, the reduction of environmental burdens is required and energy saving measures are being taken in semiconductor manufacturing factories. Therefore, it has been considered to perform power generation or the like and promote energy saving, for example, by installing a steam generation unit around a reaction vessel of a semiconductor manufacturing apparatus and using waste heat from the reaction vessel.

In the conventional technique, however, a sufficient power generation output may not be obtained, deteriorating a power generation efficiency.

SUMMARY

Some embodiments of the present disclosure provide power generation with high efficiency using waste heat.

According to one embodiment of the present disclosure, there is provided a technique that performs power generation by introducing a cooling medium for cooling a plurality of heat sources into a power generation part, wherein a plurality of cooling medium passages, through which the cooling medium for cooling the semiconductor manufacturing apparatuses flows, is installed in each of the plurality of heat sources and connected to the power generation part, and that is configured to control an opening/closing part installed in each of the plurality of cooling medium passages based on a temperature of the cooling medium that has cooled a plurality of heat sources and to control inflow of the cooling medium from the plurality of cooling medium passages to the power generation part such that a temperature of the cooling medium flowing into the power generation part is equal to or higher than a predetermined temperature.

DETAILED DESCRIPTION

One embodiment of the present disclosure will now be described with reference to the drawings.
(Configuration of the Power Generation System)

A power generation system 90 according to the present embodiment serves to connect a device having a heat source and a facility, and may be used in a factory where the entire system is installed in one house or in cooperation with the entire facility. In particular, in the case of using a semiconductor manufacturing apparatus or the like which is a heat treatment apparatus as the device having a heat source, the operation status management for each apparatus is reliably performed, making it possible to use waste heat with high efficiency by using this system. Hereinafter, an example of using a heat treatment apparatus as the device having a heat source will be described.

Figure 1:
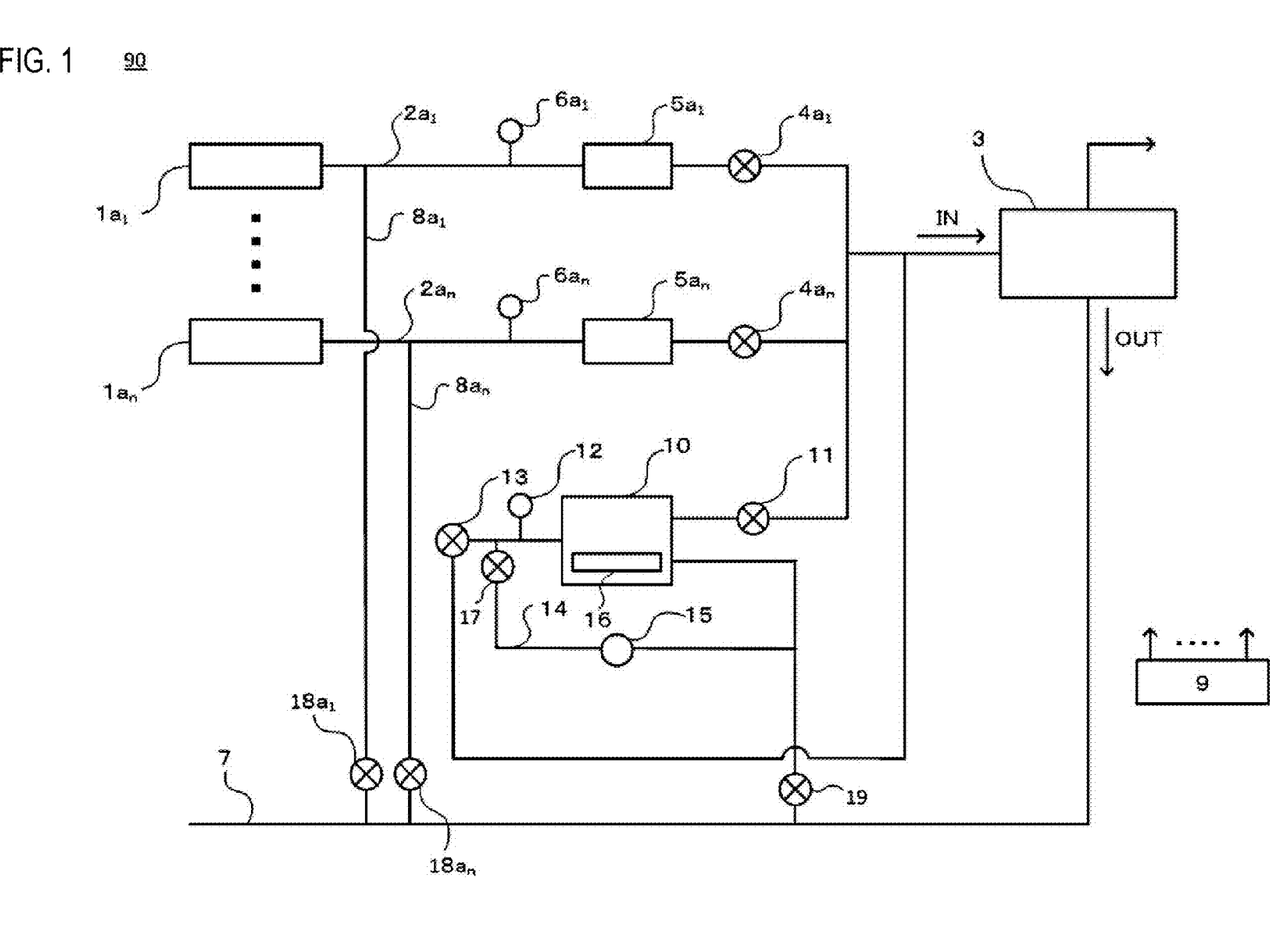
FIG. 1 is a schematic configuration diagram of a power generation system according to one embodiment of the present disclosure.

As illustrated in FIG. 1, cooling medium passages $2a_1$ to $2a_n$ through which a cooling medium for cooling each heat source flows are respectively installed in a plurality of heat treatment apparatuses $1a_1$ to $1a_n$. The cooling medium is heated by recovering waste heat from the heat source of each of the heat treatment apparatuses $1a_1$ to $1a_n$ when passing the inside of the cooling medium passages $2a_1$ to $2a_n$. Here, cooling water is used as the cooling medium. The cooling medium may be referred to as waste heat. The respective cooling medium passages $2a_1$ to $2a_n$ are merged into one at the downstream side of gas flows and are connected to a power generation part 3. In the power generation part 3, power generation is conducted by using heat of the cooling medium that has cooled the heat source of each of the heat treatment apparatuses $1a_1$ to $1a_n$. Details of the power generation part 3 will be described hereinbelow. It may also be configured such that a storage battery is connected to the power generation part 3 to store electric power generated by the power generation part 3.

The cooling medium passages $2a_1$ to $2a_n$ include temperature sensors $6a_1$ to $6a_n$ as temperature detection parts, flow rate sensors $5a_1$ to $5a_n$ as flow rate detection parts, and control valves $4a_1$ to $4a_n$ as opening/closing parts outside the heat treatment apparatuses sequentially from the upstream sides of gas flows (the heat treatment apparatus sides), respectively. In addition, branch passages $8a_1$ to $8a_n$ leading to a bypass line 7 at the upstream side of the temperature sensors $6a_1$ to $6a_n$ are formed in the respective cooling medium passages $2a_1$ to $2a_n$. Blocking valves $18a_1$ to $18a_n$ are installed between the branch passages $8a_1$ to $8a_n$ and the bypass line 7. The flow passage of the cooling medium can be changed by allowing the cooling medium to flow through the power generation part 3 or to flow through the bypass line 7 by properly opening and closing the blocking valves $18a_1$ to $18a_n$ or according to situations, The bypass line 7 is a flow passage for discharging a cooling medium which is not used for power generation (which does not flow into the power generation part 3) or a cooling medium which has been used for power generation in power generation part 3. The control valves $4a_1$ to $4a_n$ the blocking valves $18a_1$ to $18a_n$, and the power generation part 3 are controlled by a monitor server 9 which will be described later.

The power generation system 90 may be configured to include a tank 10 as a storage part for temporarily storing the cooling medium to accumulate the cooling medium. With this configuration, the cooling medium can be replenished from the tank 10 when the temperature of the cooling medium flowing into the power generation part 3 from the heat treatment apparatuses $1a_1$ to $1a_n$ drops or the flow rate is insufficient. The temperature of the cooling medium in the tank 10 is detected by a temperature sensor 12. In addition, a cooling medium passage from the outputs of the control valves $4a_1$ to $4a_n$ is connected to the upstream side of the tank 10, and a control valve 11 is installed therein. By opening the control valve 11 as necessary, the cooling medium is supplied to the tank 10 via the control valve 11. When the supply of the cooling medium to the tank 10 is surplus, the control valve 11 may be closed. A circulation passage 14 through which the cooling medium discharged from the tank 10 flows back into the tank 10 is connected to the tank 10. A control valve 17 and a pump 15 as a circulation part are installed in the middle of the circulation passage 14. When the pump 15 is stopped, the backflow of the cooling medium can be prevented by closing the control valve 17. With this configuration, the cooling medium stored in the tank 10 can be circulated. The cooling medium may be supplied to the power generation part 3 by opening the control valve 13 such that the cooling medium in the tank 10 does not exceed the capacity of the tank 10. Also, when the supply from the tank 10 to the power generation part 3 becomes surplus, the cooling medium may be released to the bypass line 7 by closing the control valves 11 and 13 and opening the control valve 17 and a discharge valve 19. It may also be configured such that the cooling medium in the tank 10 is kept at a predetermined temperature by installing a heater 16 as a heating part in the tank 10.

(Configuration of the Monitor Server)

Figure 2:
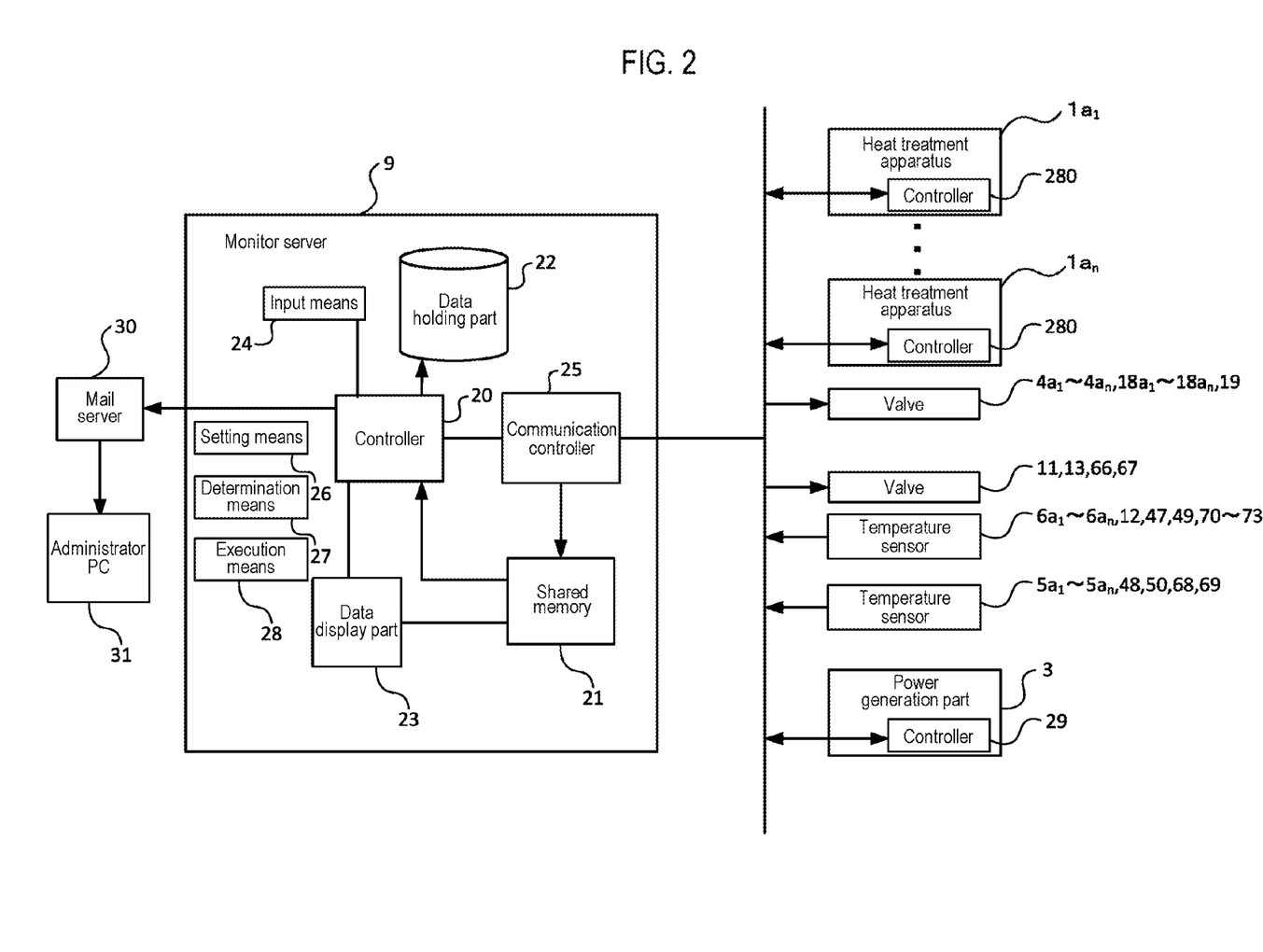
FIG. 2 is a block configuration diagram illustrating a control system of the power generation system according to one embodiment of the present disclosure.

Next, a configuration of the monitor server 9 as a power generation system management device according to the present embodiment, i.e., an upper management device, which is configured to exchange data with the heat treatment apparatuses $1a_1$ to $1a_n$ and the power generation part 3 described above and to control and monitor power generation, will be described with reference to FIG. 2.

The monitor server 9 is configured as a computer having a controller 20 configured as a central processing unit (CPU), a memory (not shown) having a shared memory area 21 therein, a data holding part (storage part) 22 as a storage means configured as a memory device such as an HDD, a data display part 23 configured as a display means such as a display device, an input means 24 such as a keyboard, and a communication controller (communication part) 25 as a communication means. The memory, the data holding part 22, the data display part 23, the input means 24, and the communication controller 25 described above are configured to exchange data with the controller 20 via an internal bus or the like. In addition, the controller 20 has a clock function (not shown).

A program executed in the monitor server 9, such as a power generation control program or the like, is stored in the data holding part (storage part) 22. Then, the power generation control program is read from the data holding part 22 and executed by the controller 20 such that various functions such as a setting means 26, a determination means 27, an execution means 28, and the like as described hereinbelow are realized.

The communication controller 25 as the communication means is connected to a controller (control part 280) for each heat treatment apparatus, the control valves $4a_1$ to $4a_n$, the flow rate sensors $5a_1$ to $5a_n$, the temperature sensors $6a_1$ to $6a_n$, and a controller 29 of the power generation part 3. The communication controller 25 is configured to receive monitor data from the heat treatment apparatuses $1a_1$ to $1a_n$, the flow rate sensors $5a_1$ to $5a_n$, the temperature sensors $6a_1$ to $6a_n$, and the power generation part 3 and to transfer the same to the shared memory 21.

The controller 20 is configured to make the monitor data read from the shared memory 21 as a database so as to be associated with IDs for specifying the heat treatment apparatuses $1a_1$ to $1a_n$ which are generation sources of the monitor data and the cooling medium passages $2a_1$ to $2a_n$ at the downstream sides of gas flows, a monitor data generation time and an elapsed time, and to transfer it to the data holding part 22 so as to be readably stored. In addition, the controller 20 is configured to transfer the monitor data to be stored in the data holding part 22 to the data display part 23 together with the IDs, the elapsed time and the like, and to display them on the data display part 23.

In the present embodiment, the controller 20 is also configured to search for the data holding part 22 based on the search conditions such as the IDs, the monitor data generation time, the elapsed time, and the like input from the input means 24, to read the monitor data corresponding to the search conditions from the data holding part 22, and to display it on the data display part 23.

(Setting Means)

The setting means 26 included in the controller 20 is configured to receive a type of data as a determination target of the power generation state, a determination condition for determination of the power generation state of a data value designated from monitor data corresponding to the type of data, a condition value as to whether or not to satisfy the determination condition, and a setting input for a predetermined operation (valve control or abnormality warning) to be performed according to the determination result. In the present embodiment, the data input to the setting means 26 is configured to be displayed on the data display part 23. The setting means 26 receives setting information of each item of "an ID" for identifying each condition, "a condition name" for displaying a name of the condition, "a type of data", "a determination condition", "a condition value", and "a predetermined operation" using the input means 24. Each item of the input condition is stored in the data holding part 22 to be associated with each other for each condition.

(Determination Means)

The determination means 27 included in the controller 20 is configured to designate a data value corresponding to a type of data for each condition out of the monitor data stored in the data holding part 22. Then, the determination means 27 is configured to compare the designated data value with the condition value, and determine whether or not the data value satisfies the determination condition.

(Execution Means)

The execution means 28 is configured to execute the aforementioned predetermined operation according to a determination result obtained by determining the data value based on a predetermined determination condition.

(Display Means)

The data display part 23 as the display means is configured to display an icon indicating a determination result or the like as to whether or not the data value satisfies the determination condition.

(Operation of the Power Generation System)

Next, an operation of the power generation system 90 according to the present embodiment will be described.

The monitor server 9 acquires, as data values, processing temperature data of the respective heat treatment apparatuses $1a_1$ to $1a_n$, flow rate data of the cooling medium of the flow rate sensors $5a_1$ to $5a_n$ of the respective cooling medium passages $2a_1$ to $2a_n$, temperature data of the cooling medium of the temperature sensors $6a_1$ to $6a_n$, and the like. When each data value acquired by the determination means 27 is compared with the condition value (reference value) and it is determined that the data value is lower than the reference value, the execution means 28 controls the control valves $4a_1$ to $4a_n$ of the cooling medium passages $2a_1$ to $2a_n$ from which the data value is detected so as to stop the supply of the cooling medium to the power generation part 3 (to close the valves). Specifically, the reference value is set such that the temperature of the cooling medium supplied (input) to the power generation part 3 is equal to or higher than a predetermined temperature, in other words, the temperature of the temperature sensor 49 (70) of the power generation part 3 is not lower than the predetermined temperature. For example, when a binary power generation as described hereinbelow is used as the power generation part 3, it is desirable that the temperature of the cooling medium supplied (input) to the power generation part be set to, for example, 90 degrees C. or higher. Furthermore, for example, when a Peltier power generation as described hereinbelow is used, it is desirable that the temperature of the cooling medium supplied (input) to the power generation part be set to, for example, 130 degrees C. or lower.

It may be configured to control the control valves $4a_1$ to $4a_n$ of the cooling medium passages $2a_1$ to $2a_n$ such that the temperature of the temperature sensor 49 (70) of the power generation part 3 is not lower than the predetermined temperature and the flow rate of the flow rate sensor 48 (69) of the power generation part 3 is equal to or higher than the reference value. For example, when one of the heat treatment apparatuses $1a_1$ to $1a_n$ stops operating, or when the operation status changes (when the temperature of the cooling medium drops), it may be configured such that the flow rate of the cooling medium from another heat treatment apparatus having a high temperature heat source that is in operation is increased and supplied to the power generation part 3.

For example, if the flow rates of the cooling medium flowing into the power generation part 3 from the cooling medium passages $2a_1$, $2a_n$ are $M_1$, ..., $M_n$, the total flow rate $M_{all}$ of the cooling medium flowing into the power generation part 3 may be expressed by the following equation (1).

$$M_{all} = \sum_{x=1}^{n} M_x \quad \text{Eq. (1)}$$

At this time, $M_{all}$ may be equal to or larger than a reference value $M_p$ ($M_{all} \geq M_p$). Furthermore, if the temperatures of the cooling medium flowing through the cooling medium passages $2a_1$, ..., $2a_n$ are $T_1$, ..., $T_n$, the temperature $T_{all}$ of the cooling medium flowing into the power generation part 3 may be expressed by the following equation (2).

$$T_{all} = \frac{\sum_{x=1}^{n} M_x \cdot T_x}{\sum_{x=1}^{n} M_x} \quad \text{Eq. (2)}$$

At this time, $T_{all}$ may be equal to or higher than a predetermined temperature $T_p$ ($T_{all} \geq T_p$).

The monitor server 9 calculates the flow rate of the cooling medium that satisfies the aforementioned conditions and controls the valves $4a_1$ to $4a_n$.

In addition, when there are surplus heat treatment apparatuses $1a_1$ to $1a_n$ in operation while acquiring processing temperature data of each heat treatment apparatus $1a_1$ to $1a_n$, the cooling medium from the surplus heat treatment apparatuses $1a_1$ to $1a_n$ is stored in the tank 10 and may be circulated and stored by operating the pump 15. The temperature sensor 12 installed in the tank 10 detects the temperature of the cooling medium in the tank 10 and the monitor server 9 controls the control valve 13 so as to secure a constant temperature and a constant storage amount of cooling medium. Here, the surplus operation means a state in which the cooling medium is not supplied to the power generation part 3, or the flow rate of the cooling medium flowing to the bypass line is larger than that of another heat treatment apparatus.

When it is determined that there is no surplus heat treatment apparatuses $1a_1$ to $1a_n$ in operation and that a sufficient cooling medium is not secured in the tank 10, the monitor server 9, which communicates with the controller 29 of the power generation part 3, confirms a change in the power generation output, and operates an abnormal alarm such as issuing an output drop alarm. As the abnormal alarm operation, for example, a warning of a decrease in power generation efficiency is displayed on the data display part 23, or an operation is executed in which a mail is transmitted to an administrator PC 31 of the power generation system 90 via the mail server 30.

(Power Generation Part)

Next, the power generation part 3 according to the present embodiment will be described.

Figure 3:
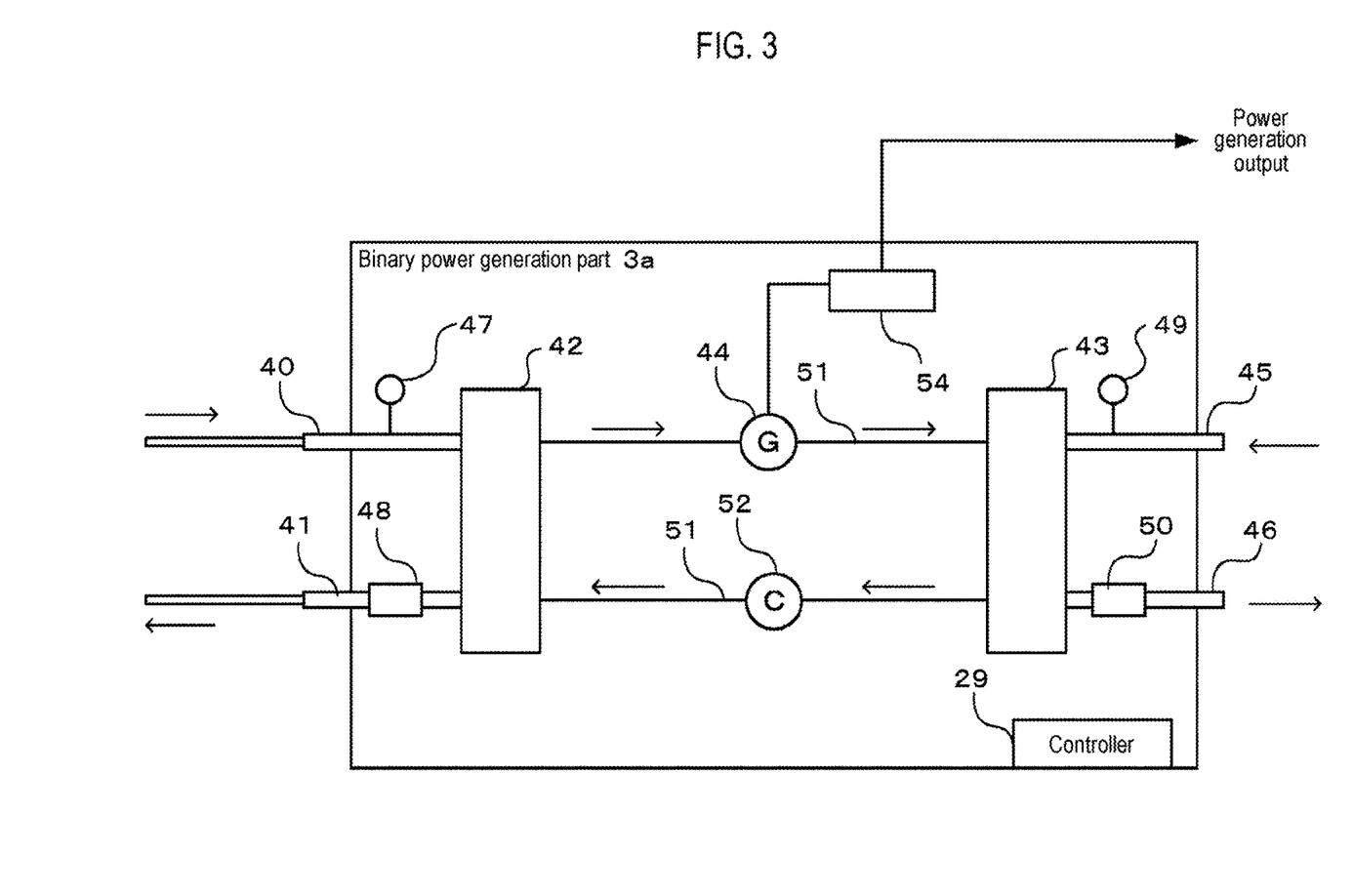
FIG. 3 is a schematic configuration diagram of a binary power generation system.

As illustrated in FIG. 3, the binary power generation part 3a, which is a first embodiment of the power generation part 3, includes an inflow passage 40 for introducing a cooling medium, a discharge passage 41 for discharging a cooling medium, a first heat exchanger 42, a second heat exchanger 43, a turbine 44, a cooling water inflow passage 45 for introducing working medium cooling water for cooling a working medium into the second heat exchanger 43, a cooling water discharge passage 46 for discharging cooling water from the second heat exchanger 43, a temperature sensor 47 installed in the inflow passage 40, a flow rate sensor 48 installed in the discharge passage 41, a temperature sensor 49 installed in the cooling water inflow passage 45, a flow rate sensor 50 installed in the cooling water discharge passage 46, a working medium passage 51 through which the working medium flows, a conditioner 54, and a controller 29. In the first heat exchanger 42, a cooling medium flows (input) from the inflow passage 40, and the working medium in the working medium passage 51 is heated by the cooling medium. The cooling medium that transfers a thermal energy from and to the working medium via the first heat exchanger 42 is discharged to the outside of the power generation part (binary power generation part 3a) via the discharge passage 41.

The working medium, which is heated by the first heat exchanger 42 to become a high temperature and high pressure gas, drives (rotates) the turbine 44 as a power generation drive part installed in the working medium passage 51 to generate electric power. The working medium that drives the turbine 44 flows into the second heat exchanger 43. The working medium flowing into the second heat exchanger 43 is cooled by the working medium cooling water flowing into the cooling water inflow passage 45 and liquefied into a low temperature liquid. The working medium cooling water that cools the working medium is discharged from the cooling water discharge passage 46. The liquefied working medium is compressed by a compressor 52, and then sent to the first heat exchanger 42 and circulated in the working medium passage 51. This circulation cycle is called a thermal cycle. Electricity generated by the turbine 44 is output as a power generation output (AC power) via a conditioner 54 as a rectification part.

The temperature sensors 47 and 49, the flow rate sensors 48 and 50, the turbine 44, the compressor 52, and the conditioner 54 are electrically connected to the controller 29 and are monitored by the controller 29 such that the power generation efficiency is stabilized. The controller 29 is configured to control the compressor 52 and the turbine 44 to stabilize the power generation output of the conditioner 54 in order to control the power generation state.

The binary power generation part 3a can obtain a power generation output with the maximum operation efficiency, for example, by introducing a cooling medium of 90 degrees C. or higher at a flow rate of 200 L/min or larger. At this time, in order to maintain a high operation efficiency, for example, the temperature of the working medium cooling water needs to be 20 degrees C. or lower. That is, it is desirable that the temperature difference during operation be set to (the temperature of the cooling medium)–(the temperature of the working medium cooling water)≥70 degrees C. and (the flow rate of the cooling medium)≥200 L/min. If the aforementioned conditions are not satisfied, it affects the power generation efficiency and becomes difficult to obtain a stable power generation output.

The monitor server 9 acquires monitor data from the temperature sensors $6a_1$ to $6a_n$ and the flow rate sensors $5a_1$ to $5a_n$, and determines that the predetermined temperature $T_p$ is, for example, 90 degrees C. and the reference value $M_p$ is, for example, 200 L/min, calculates the supply flow rate of the cooling medium and controls the valves $4a_1$ to $4ap$. The predetermined temperature $T_p$ and the reference value $M_p$ are appropriately set so as to achieve a desired power generation amount according to the performance of the binary power generation part 3a.

(Peltier Power Generation Part)

Figure 5:
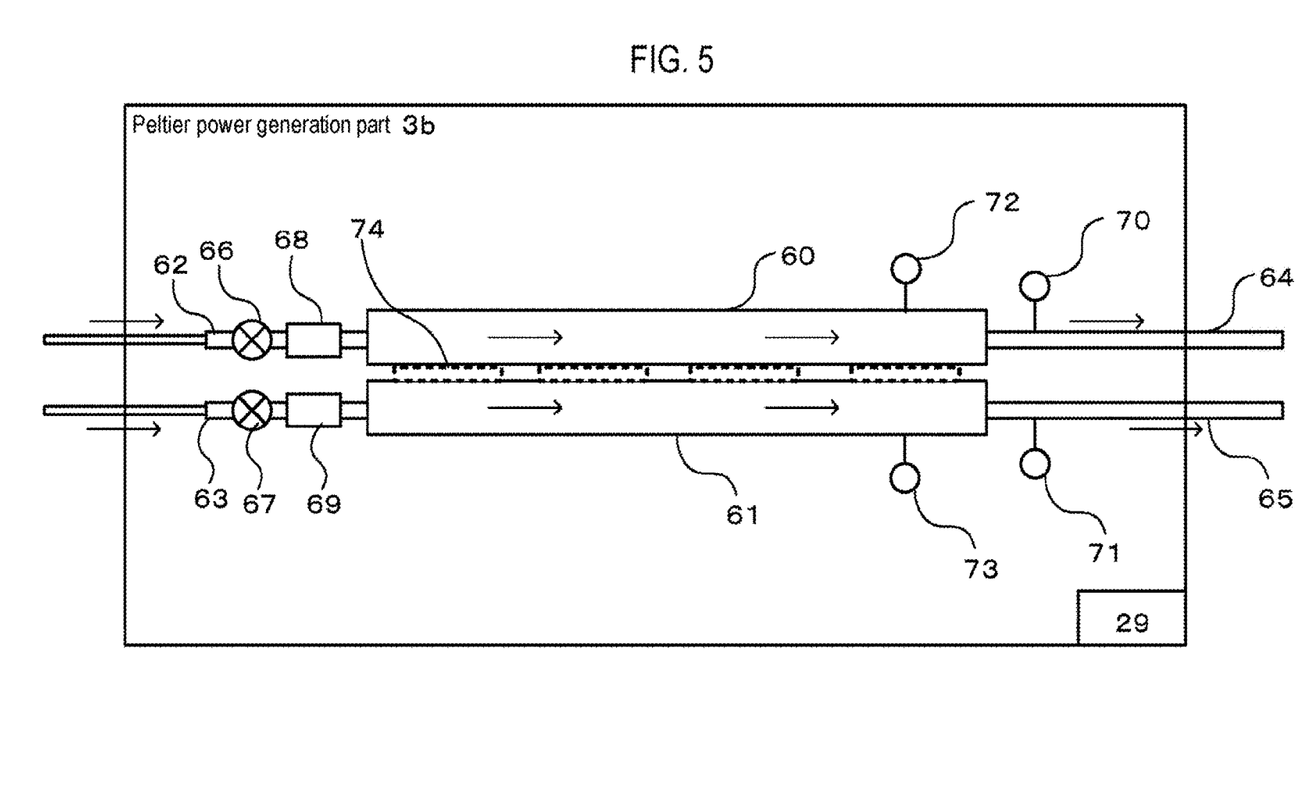
FIG. 5 is a schematic diagram illustrating a power generation concept of a Peltier element.

Next, a configuration of a Peltier power generation part 3b, which is a second embodiment of the power generation part 3 according to the present embodiment, will be described.

Figure 4:
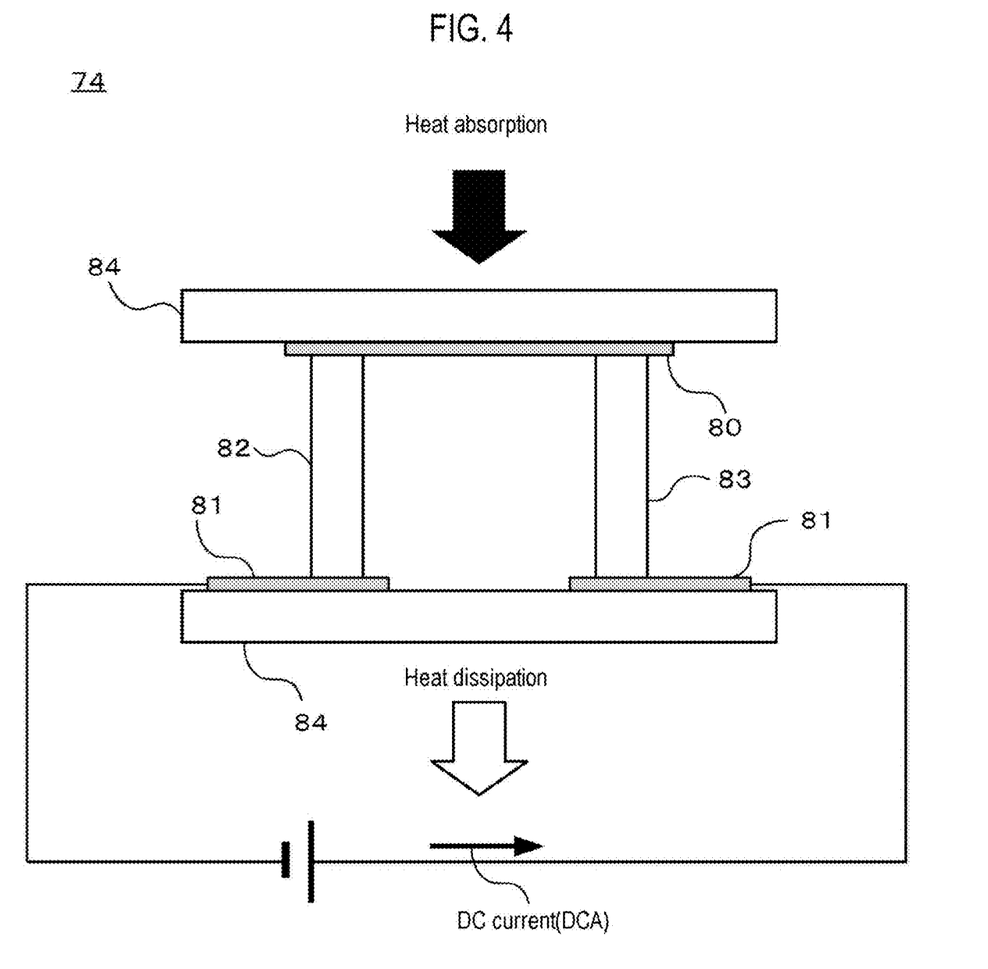
FIG. 4 is a schematic configuration diagram of a Peltier power generation system.

Here, a power generation concept of a Peltier element 74 which is a power generating element will be described. As illustrated in FIG. 4, the Peltier element includes a pair of metal electrodes 80 and 81, and a P-type semiconductor 82 and an N-type semiconductor 83 sandwiched between the pair of metal electrodes. As the metal electrode, for example, a copper electrode is used. The P-type semiconductor 82 and the N-type semiconductor 83 are electrically connected in series. Ceramic substrates 84 are bonded above and below the pair of metal electrodes 80 and 81. In the upper and lower ceramic substrates 84, heat absorption and heat dissipation are performed, causing a temperature difference between the upper and lower copper electrodes 80 and 81.

Due to this temperature difference, a thermoelectromotive force is generated by a physical phenomenon called a Seebeck effect. A DC current generated by the thermoelectromotive force generated by the Seebeck effect flows between the respective metal electrodes 80 and 81 connected to the P-type semiconductor 82 and the N-type semiconductor 83. This is the basic concept of the Peltier power generation. In the second embodiment, the power generation is performed using such a basic concept.

As illustrated in FIG. 5, the Peltier power generation part 3b includes an upper cooling plate 60, a lower cooling plate 61, an upper plate inflow passage 62 for supplying a cooling medium to the upper cooling plate 60, a lower plate inflow passage 63 for supplying a cooling medium to the lower cooling plate 61, an upper plate discharge passage 64 for discharging a cooling medium from the upper cooling plate 60, a lower plate discharge passage 65 for discharging a cooling medium from the lower cooling plate 61, an upper valve 66 installed in the upper plate inflow passage 62, a lower valve 67 installed in the lower plate inflow passage 63, an upper flow rate sensor 68 installed in the upper plate inflow passage 62, a lower flow rate sensor 69 installed in the lower plate inflow passage 63, an upper temperature sensor 70 installed in the upper plate discharge passage 64, a lower temperature sensor 71 installed in the lower plate discharge passage 65, an upper plate temperature sensor 72 installed in the upper cooling plate 60, a lower plate temperature sensor 73 installed in the lower cooling plate 61, and a plurality of Peltier elements 74 between the upper cooling plate 60 and the lower cooling plate 61. The plurality of Peltier elements 74 are connected in series or in parallel with each other and are installed between the upper cooling plate 60 and the lower cooling plate 61.

The temperature sensors 70, 71, 72 and 73, the flow rate sensors 68 and 69, and the Peltier elements 74 are electrically connected to the controller 29 and are monitored by the controller 29 so as to stabilize the power generation efficiency. The controller 29 is configured to stabilize the power generation output in order to control the power generation state.

As illustrated in FIG. 5, the valves 66 and 67 are controlled by the controller 29. Furthermore, the power generation amounts of the flow rate sensors 68 and 69, the temperature sensors 70, 71, 72 and 73, and the Peltier power generation part 3b are monitored by the controller 29. The controller 29 is electrically connected to the monitor server 9. With this configuration, the stable temperature control can be performed.

The cooling medium passages $2a_1$ to $2a_n$ are respectively connected to the upper plate inflow passage 62 and the lower plate inflow passage 63. The flow rate of the cooling medium flowing into the lower plate inflow passage 63 and the upper plate inflow passage 62 is detected by the upper flow rate sensor 68 and the lower flow rate sensor 69 and is transmitted as flow rate data from the controller 29 to the monitor server 9. Based on the temperature of the cooling medium obtained by the temperature sensor 70, the monitor server 9 controls the opening degrees of the valves $4a_1$ to $4a_n$ and the upper valve 66 and controls the flow rate of the cooling medium such that the surface temperature of the upper cooling plate 60 is, for example, equal to or lower than 130 degrees C. Similarly, based on the temperature of the cooling medium obtained by the temperature sensor 71, the monitor server 9 controls the opening degrees of the valves $4a_1$ to $4a_n$ and the lower valve 67 and controls the flow rate of the cooling medium such that the surface temperature of the lower cooling plate 61 is, for example, a room temperature or a normal temperature (for example, 20 degrees C.).

For example, if the flow rates of the cooling medium flowing into the upper cooling plate 60 from the cooling medium passages $2a_1, \ldots, 2a_n$ are $M_{u1}, \ldots, M_{un}$ and the temperatures of the cooling medium are $T_1, \ldots, T_n$, the temperature $T_u$ of the cooling medium flowing into the upper cooling plate 60 may be expressed by the following equation (3).

$$T_u = \frac{\sum_{x=1}^{n} M_{ux} \cdot T_x}{\sum_{x=1}^{n} M_{ux}} \qquad \text{Eq. (3)}$$

If the flow rates of the cooling medium flowing into the lower cooling plate 61 from the cooling medium passages $2a_1, \ldots, 2a_n$ are $M_{b1}, \ldots, M_{bn}$ and the temperatures of the cooling medium are $T_1, \ldots, T_n$, the temperature $T_b$ of the cooling medium flowing into the upper cooling plate 60 may be expressed by the following equation (4).

$$T_b = \frac{\sum_{x=1}^{n} M_{bx} \cdot T_x}{\sum_{x=1}^{n} M_{bx}} \qquad \text{Eq. (4)}$$

At this time, the monitor server 9 controls the inflow flow rates of the cooling medium to the upper cooling plate 60 and the lower cooling plate 61 so as to satisfy $T_n - T_b \geq 70$ degrees C. and $T_u \leq 130$ degrees C.

In the present embodiment, the Peltier power generation part 3b is one unit, but multiple units may be connected in parallel or in series. With this configuration, even greater electric power can be obtained.

(Configuration of the Heat Treatment Apparatus)

Figure 6:
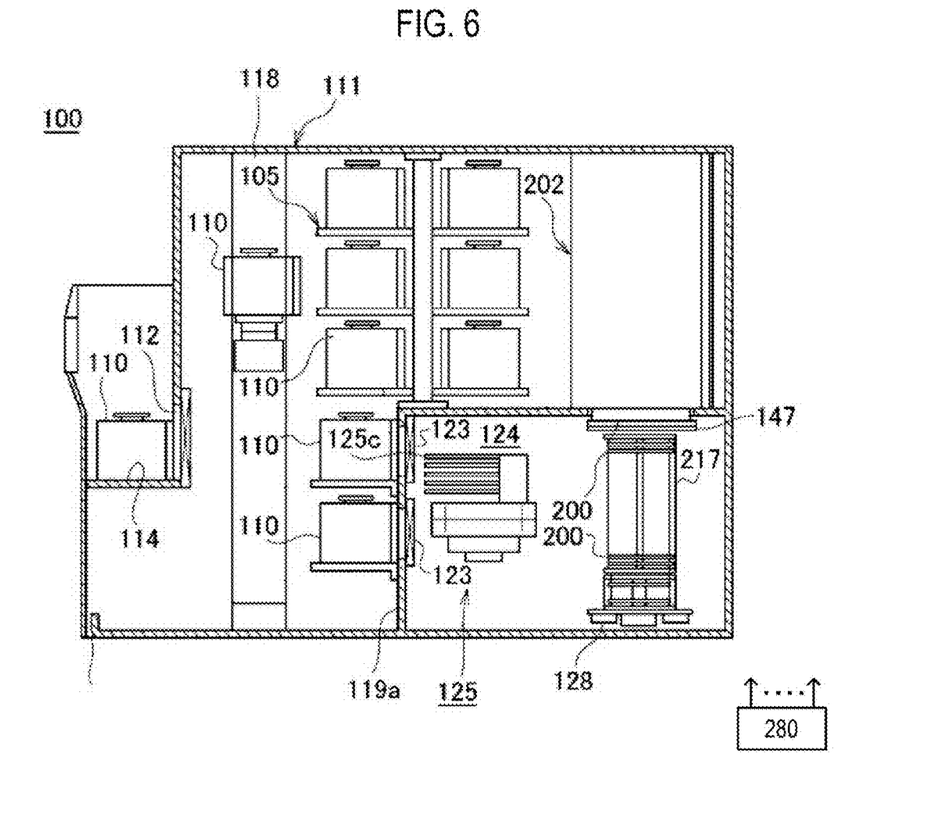
FIG. 6 is a vertical cross sectional view of a substrate processing apparatus.

Next, a configuration of the heat treatment apparatus in which a heating part is used as a heat source according to the present embodiment will be described. The substrate processing apparatus 1a as the heat treatment apparatus performs substrate processing such as heat treatment, a film forming process or the like, which is one of the manufacturing processes in a method of manufacturing a semiconductor device. In the present embodiment, for example, it is configured as a vertical type substrate processing apparatus 100 (hereinafter, referred to as a processing apparatus).

As illustrated in FIG. 6, the processing apparatus 100 according to the present embodiment includes a housing 111. A pod 110, which is a wafer carrier (substrate container) that accommodates a plurality of wafers W as substrates, is loaded into the substrate processing apparatus from a pod loading/unloading port 112 formed on the front wall of the housing 111.

A pod transfer device 118 is installed near the pod loading/unloading port 112 in the housing 111, and a pod shelf 105 is installed above a substantially central portion in the longitudinal direction in the housing 111. The pod transfer device 118 is configured to transfer the pod 110 among the pod loading/unloading port 112, the pod shelf 105 and pod openers 123.

A transfer chamber 124 is installed at a lower portion in the housing 111 from the substantially central portion in the longitudinal direction in the housing 111 to the rear end. The pod openers 123 for opening and closing a cover of the pod 110 are installed on the front wall 119a of the transfer chamber 124 in two upper and lower stages.

A wafer transfer device 125, a boat 217, and a boat elevator 115 are installed in the transfer chamber 124. The wafer transfer device 125 includes a tweezer 125c as a loading part of the wafers W, and is configured to load (charge) and unload (discharge) the wafers W from the pod 110 to the boat (substrate support) 217.

A process furnace 202 as a process vessel configured to process the wafers W is installed above the transfer chamber 124. The lower end of the process furnace 202 is configured to be opened and closed by a furnace port shutter (furnace opening/closing mechanism) 147. A clean unit that supplies a cleaned atmosphere or a clean air that is an inert gas is installed at a side end of the transfer chamber 124. A configuration of the process furnace 202 will be described hereinbelow.

An arm is connected to the boat elevator 115, and a seal cap 128 as a furnace port cover is horizontally installed on the arm. The seal cap 128 vertically supports the boat 217 and is configured to close the lower end of the process furnace 202. The boat 217 is configured to horizontally support a plurality of wafers W (for example, about 25 to 150 wafers) in such a state that the wafers W are arranged along a vertical direction.

(Configuration of the Process Furnace)

Next, a configuration of the process furnace 202 according to the present embodiment will be described.

Figure 7:
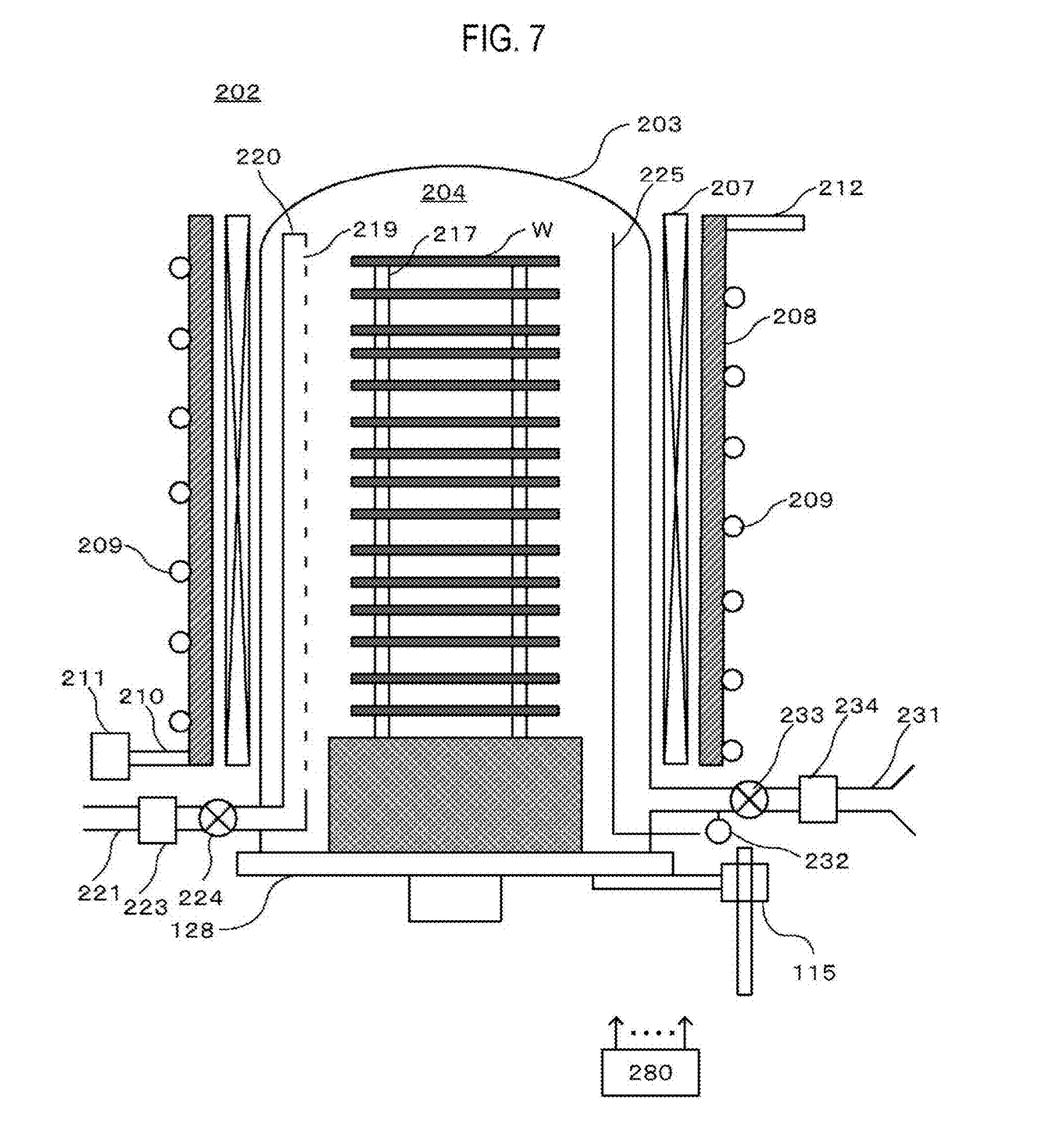
FIG. 7 is a vertical cross sectional view of a process furnace of the substrate processing apparatus.

As illustrated in FIGS. 6 and 7, the process furnace 202 includes a reaction tube 203. A process chamber 204 configured to process the wafers W is formed in a hollow cylindrical portion of the reaction tube 203. The process chamber 204 is configured to accommodate the boat 217 that supports the wafers W.

A heater 207 as a heating part for heating the wafers W in the reaction tube 203 is installed outside the reaction tube 203 so as to surround the sidewall surface of the reaction tube 203. The heater 207 has a cylindrical shape and is supported by a heater base serving as a retaining plate so as to be vertically installed.

A temperature sensor 225 such as a thermocouple or the like is installed as a temperature detector in the reaction tube 203. The heater 207 and the temperature sensor 225 are electrically connected to the controller 280. Based on temperature data detected by the temperature sensor 225, the controller 280 is configured to adjust electric power supplied to the heater 207 such that the interior of the process chamber 204 has a desired temperature distribution at a desired timing.

The supply of a process gas into the process chamber 204 is performed by a process gas supply part. The process gas supplied by the process gas supply part is changed according to the kind of a film to be formed. The process gas supply part includes a gas supply pipe 221, and a mass flow controller (MFC) 223 and a valve 224 are sequentially installed in the gas supply pipe 221 from the upstream side of gas flows. The gas supply pipe 221 is connected to a nozzle 220. The nozzle 220 is erected in the reaction tube 203 along the vertical direction, and a plurality of supply holes 219 which are opened toward the wafers W supported by the boat 217 are formed therein. The process gas is supplied to the wafers W through the supply holes 219 of the nozzle 220.

An exhaust pipe 231 for exhausting the internal atmosphere of the reaction tube 203 (process chamber 204) is connected to the reaction tube 203. A pressure sensor 232 for detecting the internal pressure of the process chamber 204, an auto pressure controller (APC) valve 233, and a vacuum pump 234 are installed in the exhaust pipe 231 sequentially from the upstream side of gas flows.

A heat insulating member 208 is disposed in the outer periphery of the heater 207 so as to cover the heater 207. A cooling medium passage 209 (2a) through which a cooling medium for cooling the heater 207 flows is disposed in the outer periphery of the heat insulating member 208. The cooling medium passage 209 is formed of, for example, a single continuous pipe member and is arranged in a spiral shape, and for example, cooling water is introduced as the cooling medium. The cooling medium passage 209 is installed on the outer surface of the heat insulating member 208, and a fluid switching device 211 is connected to one end side 210 of the cooling medium passage 209. The cooling medium supplied from the fluid switching device 211 is introduced into the cooling medium passage 209 via the one end portion 210 and the cooling medium introduced into the cooling medium passage 209 is discharged from the other end side 212 of the cooling medium passage 209. The other end 212, which is the discharge side of the cooling medium passage 209, extends to the power generation part 3 and is connected to the power generation part 3. The cooling medium passage 209 may also be formed so as to be embedded in the heat insulating member 208.

(Operation of the Substrate Processing Apparatus)

Next, an operation of the processing apparatus 100 according to the present embodiment will be described with reference to FIG. 6.

(Pod Transfer Step)

When the pod 110 is supplied to the load port 114, the pod 110 loaded into the housing 111 from the pod loading/unloading port 112 is transferred to the pod shelf 105 by the pod transfer device 118 and temporarily stored, and then transferred from the pod shelf 105 to the pod opener 121.

(Wafer Transfer Step)

The cover of the pod 110 loaded on the pod opener 121 is removed by a cover detachable mechanism of the pod opener 121. Thereafter, the wafers W are picked up from the inside of the pod 110 by the tweezer 125c of the wafer transfer device 125 and loaded into the boat 217.

(Boat Transfer Step)

When a predetermined number of wafers W are loaded into the boat 217, the lower end portion of the process chamber 204 that has been closed by the furnace port shutter 147 is opened. Subsequently, the seal cap 128 is lifted up by the boat elevator 115 and the boat 217 supporting the wafers W is loaded into the process chamber 204 (boat loading).

(Temperature-Rising Step)

After the boat loading, the interior of the process chamber 204 is heated by the heater 207 to raise (ramp up) the temperature from a first temperature to a second arbitrary temperature.

(Substrate-Processing Step)

Thereafter, any substrate processing is performed on the wafers W in the process chamber 204. For example, a thin film is formed on the wafers W by maintaining the interior of the process chamber 204 at any temperature and supplying a process gas from the process gas supply part to the wafers W. By allowing a cooling medium to flow through the cooling medium passage 209, the interior of the process chamber 204 is kept heated to a desired temperature while suppressing heat dissipation of the heater 207 to the outside of the substrate processing apparatus.

(Temperature-Dropping Step)

After the substrate processing, the heating in the process chamber 204 by the heater 207 is stopped and the temperature is dropped (ramped down) from the second temperature to a third temperature.

(Boat-Unloading Step)

After the temperature is dropped to the third temperature, the boat 217 is unloaded from the interior of the process chamber 204 (boat unloading).

The processed wafers W are transferred from the boat 217 to the pod 110, and the pod 110 storing the wafers W is unloaded to the outside of the housing 111 in reverse order of the above.

The cooling water always flows through the cooling medium passage 209. For example, it is considered that the temperature of the cooling medium will fluctuate in the case of ramp up or ramp down, in other words, according to the heating status (operation status) of the heater 207. The monitor server 9 acquires, for example, the temperature data from the temperature sensor 225 via the controller 280 and monitors the operation status of the processing apparatus 1a. Furthermore, for example, the monitor server 9 acquires information on which step the processing apparatus 1a is in via the controller 280, and monitors the operation status of the processing apparatus 1a.

<Effects According to the Present Embodiment>

According to the present embodiment, one or more effects as set forth below may be achieved.

(1) Since the input to the power generation part can be adjusted to correspond to the operation status of each of the plurality of heat sources, it is possible to stably supply the generated power. This is because, in the conventional technique, the power generation control for unifying and managing a plurality of inputs (e.g., a cooling medium or the like) or the like required for power generation is not performed, so it is sometimes impossible to stably supply the generated power. On the other hand, according to the present embodiment, since the plurality of inputs can be monitored and controlled, it is possible to control the generated power and to stably supply electric power.

(2) By managing the operation status of the plurality of heat sources, it is possible to predict the power generation situation in the power generation part. By managing the operation status of the heat sources, it is possible to predict the changes in the status of inputs to the power generation part, and to predict and manage the power generation situation.

(3) By establishing the monitor server that unifies and collects the information from the heat sources and the power generation part, it is possible to comprehensively manage all the information changes. This enables the cooperative and combined operation with other power generation systems.

The embodiments of the present disclosure have been specifically described above. However, the present disclosure is not limited to the aforementioned embodiments and various modifications may be made without departing from the spirit of the present disclosure.

For example, heat dissipation from a process furnace (high temperature air or the like) or heat dissipation from an exhaust pipe connected to the process furnace may be used in addition to the heater of the process furnace as the heat source. In addition, when there is an exhaust pump or the like, any medium having heat such as heat of a motor or waste heat of a compression part of a pump body may be used. In the case of a heat treatment apparatus, for example, a heating member (heater) installed outside a reaction vessel, a heated reaction vessel, a heated substrate, a refrigerant (a gas or cooling water) for cooling the reaction vessel or reaction vessel member, or the like may be used.

This system is a system that enables the same control as the waste heat power generation for various waste heat power generations, and also enables, as its application range, a wide range of applications such as a direct waste heat power generation system, a mechanical vibration power generation system, a thermoacoustic power generation system and the like.

According to the present disclosure in some embodiments, it is possible to provide power generation with high efficiency by using waste heat.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A power generation system for performing power generation by introducing a cooling medium for cooling a plurality of semiconductor manufacturing apparatuses into a power generation part, the system comprising:
    a plurality of cooling medium passages, through which the cooling medium for cooling the semiconductor manufacturing apparatuses flows, installed in each of the plurality of semiconductor manufacturing apparatuses and connected to the power generation part;
    a first control valve installed in each of the plurality of cooling medium passages at an upstream side of the plurality of cooling medium passages being merged into one;
    a temperature sensor installed in each of the plurality of cooling medium passages at an upstream side of the first control valve and configured to detect a temperature of the cooling medium that has cooled the semiconductor manufacturing apparatuses;
    a bypass line which is a flow passage configured to discharge the cooling medium that is not used for power generation and the cooling medium that has been used for power generation in the power generation part;
    a branch passage that branches from each of the plurality of cooling medium passages at an upstream side of the temperature sensor and configured to allow the cooling medium to flow through the bypass line;
    a blocking valve installed between the branch passage and the bypass line;
    a tank connected to the plurality of cooling medium passages from an output of the first control valve via a second control valve and configured to store the cooling medium that does not flow into the power generation part; and
    a third control valve configured to supply the cooling medium stored in the tank to the power generation part,
    wherein the first control valve is configured to control inflow of the cooling medium from the plurality of cooling medium passages to the power generation part based on the temperature of the cooling medium that has cooled a plurality of heat sources, such that the temperature of the cooling medium flowing into the power generation part is equal to or higher than a predetermined temperature.

2. A management device comprising the power generation system of claim 1, wherein the management device is configured to exchange data with the plurality of semiconductor manufacturing apparatuses and the power generation part, and to control and monitor power generation.

3. The system of claim 1, wherein a flow rate of the cooling medium is detected by a flow rate detection part installed in each of the cooling medium passages.

4. The system of claim 3, wherein an inflow amount of the cooling medium flowing into the power generation part from each of the plurality of cooling medium passages is calculated based on the temperature of the cooling medium that has cooled the semiconductor manufacturing apparatuses, and the first control valve installed in each of the plurality of cooling medium passages is controlled according to the inflow amount, such that the temperature of the cooling medium flowing into the power generation part is equal to or higher than the predetermined temperature.

5. The system of claim 4, wherein the first control valve is controlled to close the first control valve when the temperature of the cooling medium is lower than the predetermined temperature.

6. The system of claim 1, wherein the power generation part is a binary power generator, and the predetermined temperature is 90 degrees C. or higher.

7. The system of claim 6, wherein a heating member is controlled to heat the cooling medium in the tank so as to keep the temperature of the cooling medium equal to or higher than the predetermined temperature.

8. The system of claim 7, wherein the cooling medium in the tank is introduced into the power generation part when the temperature or a flow rate of the cooling medium from the semiconductor manufacturing apparatuses is insufficient.

9. The system of claim 1, wherein an alarm is configured to be issued when the temperature or a flow rate of the cooling medium is insufficient and a power generation efficiency by the power generation part is at a predetermined value or lower.

10. The system of claim 6, wherein the power generation part includes:
    a first heat exchanger configured to introduce the cooling medium and heat a working medium;
    a turbine connected to the first heat exchanger and driven by the heated working medium to generate electric power;
    a second heat exchanger connected to the turbine and configured to cool the working medium; and
    a compressor configured to recirculate the working medium cooled by the second heat exchanger to the first heat exchanger.

11. The system of claim 1, wherein the power generation part includes:
    a first plate configured to introduce the cooling medium into the power generation part at a first temperature;
    a second plate configured to introduce the cooling medium into the power generation part at a second temperature lower than the first temperature; and
    a power generation element interposed between the first plate and the second plate.

12. The system of claim 1, wherein the cooling medium is cooling water or a gas.

* * * * *